(12) United States Patent
Hwang (10) Patent No.: US 8,338,211 B2
(45) Date of Patent: Dec. 25, 2012

(54) SYSTEMS AND METHODS FOR CHARGING SOLAR CELL LAYERS

(75) Inventor: Jeong-Mo Hwang, San Jose, CA (US)

(73) Assignee: Amtech Systems, Inc., Tempe, AZ (US)

( * ) Notice: Subject to any disclaimer, the term of this patent is extended or adjusted under 35 U.S.C. 154(b) by 15 days.

(21) Appl. No.: 13/050,915

(22) Filed: Mar. 17, 2011

(65) Prior Publication Data
US 2012/0028398 A1  Feb. 2, 2012

Related U.S. Application Data

(63) Continuation-in-part of application No. 12/844,746, filed on Jul. 27, 2010.

(51) Int. Cl.
*H01L 21/00* (2006.01)
(52) U.S. Cl. .......... 438/57; 136/252; 136/258; 136/261; 257/E21.24; 438/513; 438/783; 438/798
(58) Field of Classification Search .................. 136/252, 136/258, 261; 257/E21.24; 438/57, 513, 438/783, 798
See application file for complete search history.

(56) References Cited

U.S. PATENT DOCUMENTS

| 4,253,881 | A | 3/1981 | Hezel |
| 2007/0029194 | A1 | 2/2007 | Matsumoto et al. |
| 2008/0150002 | A1 | 6/2008 | Hwang |
| 2009/0168517 | A1 | 7/2009 | Scade et al. |
| 2009/0283139 | A1 | 11/2009 | Chen et al. |
| 2010/0203742 | A1* | 8/2010 | Borden et al. ............... 438/783 |
| 2010/0311203 | A1* | 12/2010 | Borden et al. ............... 438/98 |
| 2011/0136286 | A1* | 6/2011 | Stewart et al. ............... 438/57 |

FOREIGN PATENT DOCUMENTS

EP  0648069  4/1995
(Continued)

OTHER PUBLICATIONS

Jan Benick, "Surface Passivation of Boron Diffused Emitters for High Efficiency Solar Cells," Photovoltaic Specialists Conference, May 11-16, 2008, 33rd IEEE, pp. 1-5.*

(Continued)

*Primary Examiner* — Asok K Sarkar
(74) *Attorney, Agent, or Firm* — Snell & Wilmer L.L.P.

(57) ABSTRACT

Systems and methods of the present invention can be used to charge a charge-holding layer (such as a passivation layer and/or antireflective layer) of a solar cell with a positive or negative charge as desired. The charge-holding layer(s) of such a cell can include any suitable dielectric material capable of holding either a negative or a positive charge, and can be charged at any suitable point during manufacture of the cell, including during or after deposition of the passivation layer (s). A method according to one aspect of the invention includes disposing a solar cell in electrical communication with an electrode inside a chamber. The solar cell includes an emitter, a base, a first passivation layer adjacent the emitter, and a second passivation layer adjacent the base. Gas is injected into the chamber and a plasma (with photons having an energy level of at least about 3.1 eV) is generated using the gas. One or more of the first passivation layer and the second passivation layer is charged to a predetermined polarity, wherein the charging includes applying a direct current voltage pulse to the electrode for a predetermined period of time.

21 Claims, 10 Drawing Sheets

FOREIGN PATENT DOCUMENTS

| | | | |
|---|---|---|---|
| JP | 2005 183469 | * | 7/2005 |
| JP | 2005183469 | | 7/2005 |

OTHER PUBLICATIONS

International Search Report dated Jul. 27, 2012 in Application No. PCT/US2012/029688.

USPTO; Office Action dated Aug. 20, 2012 in U.S. Appl. No. 12/844,746.

EPO; Search Report dated Jul. 23, 2012 in Application No. 11175497.4.

J. Schmidt et al., "Surface Passivation of High-efficiency Silicon Solar Cells by Atomic-layer-deposited AI2O3," Prog. Photovolt: Res. Appl. 2008; pp. 461-466.

Jan Benick et al., "High-Efficiency Solar Cells of n-type Silicon," 1 page.

Jan Schmidt et al., "Progress in the Surface Passivation of Silicon Solar Cells," 23rd European Photovoltaic Energy Conference, Sep. 2008, 8 pages.

Jin H et al., "Introduction of Negative Charges in Nitride for PV Applications," Photovoltaic Specialists Conference (PVSV), 2009 34th IEEE, Jun. 7, 2009.

Elgamel, H. E. et al., "Efficient Combination of Surface and Bulk Passivation Schemes of High-Efficiency Multicrystalline Silicon Solar Cells," Journal of Applied Physics, Sep. 1, 1995.

* cited by examiner

SYSTEMS AND METHODS FOR CHARGING SOLAR CELL LAYERS

CROSS-REFERENCE TO RELATED APPLICATIONS

This application is a continuation-in-part of, and claims priority under 35 U.S.C. §§119 and 120 to, U.S. patent application Ser. No. 12/844,746, entitled "Charge Control of Solar Cell Passivation Layers," filed Jul. 27, 2010 by Jeong-Mo Hwang, the disclosure of which is incorporated herein by reference.

DESCRIPTION OF THE INVENTION

1. Field of the Invention

The present invention relates systems and methods for charging layers of semiconductors, particularly in solar cell applications.

2. Background of the Invention

Figure 1:
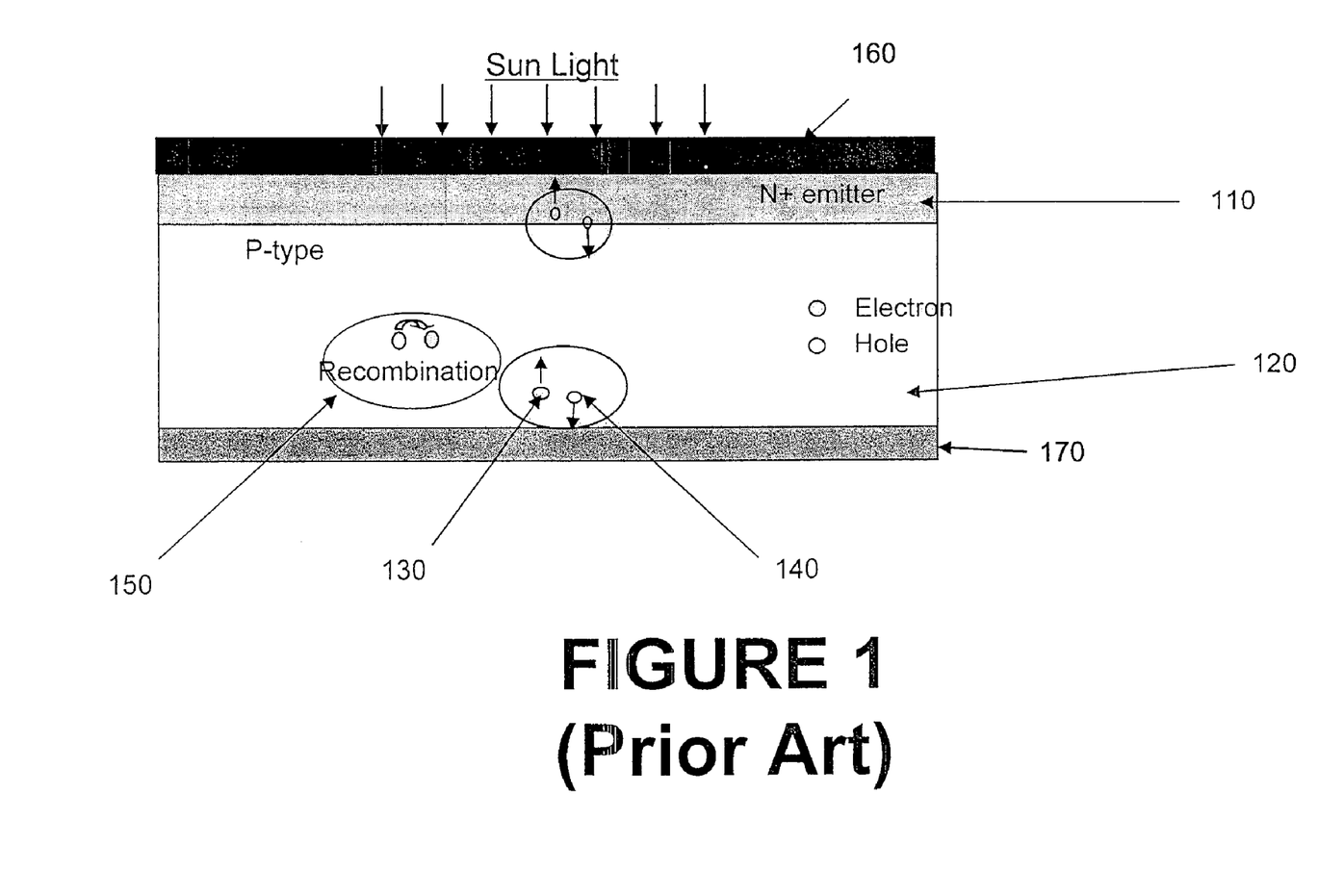
FIG. 1 illustrates the configuration of a conventional solar cell.

Solar cells (also known as photovoltaic cells) convert light energy into electricity. FIG. 1 illustrates a common solar cell 100 that includes n-type semiconductor layer 110 in contact with a thick p-type semiconductor layer (substrate) 120. The interface of these layers is known as a "p-n junction." This type of a p-type substrate solar cell is called a p-type cell. In p-type semiconductors, the hole (the absence of valence electrons) is the majority carrier and the free electron is the minority carrier. In n-type semiconductors, by contrast, the electron is the majority carrier and the hole is the minority carrier. As a photon (e.g., from sunlight) with an energy higher than the semiconductor band-gap enters the cell 100; it is absorbed by generating a free electron 130 and hole 140 pair in the cell 100. Sunlight contains photons with a wide range of energies from infra-red to ultraviolet. Higher energy photons (or shorter wave-length light) are absorbed near the semiconductor surface while lower energy photons (or long wavelength light) penetrate to deeper regions of the substrate. Photo-generated minority-carrier electrons 130 in the p-type semiconductor layer 120 move toward the p-n junction by diffusion and collect to the n-type layer, which causes an electrical current. Electrons 130 and holes 140 in the cell tend to "recombine" (150) with each other, particularly at defect sites. As electrons and holes recombine, however, they cease to contribute to the electrical current generation, thereby decreasing the efficiency of the solar cell.

Photo-generated minority carriers (i.e., holes in n-type semiconductors or electrons in p-type semiconductors) tend to recombine more quickly through surface defects formed by the abrupt termination of the semiconductor material at the front and back surfaces of the semiconductor. This phenomenon is often referred to as "surface recombination" and is measured in surface recombination velocity.

In thinner semiconductor wafers, which many manufacturers seek to produce in order to reduce the cost of manufacturing solar cells, surface recombination (particularly at the back surface) is more significant, while bulk recombination becomes less significant. The thinner the semiconductor, the greater the number of photo-generated carriers at the back surface, while the loss of photo-generated minority carriers due to bulk recombination decreases because the semiconductor thickness becomes comparable to or smaller than the minority-carrier diffusion length. In thin semiconductors, therefore, the efficiency loss due to back surface recombination has a greater effect on the total efficiency of the solar cell.

Referring again to FIG. 1, it is known to apply a coating 160 to the front surface of a solar cell to act as both an antireflective coating and a passivation layer to help prevent electron/hole recombination on the surface. Where the top surface of a solar cell comprises an n-type semiconductor, the coating 160 often includes silicon nitride ($Si_3N_4$), which is typically applied using a process known as plasma-enhanced chemical vapor deposition (PECVD). PECVD silicon nitride normally includes a large density of positive charges, and while it is a suitable coating for the n-type portion of a solar cell (such as the N+ emitter 110 in FIG. 1), silicon nitride is not a good choice for coating the p-type portion of a solar cell (such as the P-type base 120 in FIG. 1) because the positive charge density of PECVD silicon nitride tends to interact with the p-type material to cause a detrimental effect known as "parasitic shunting." See *Surface Passivation of High-efficiency Silicon Solar Cells by Atomic-layer-deposited $Al_2O_3$*, J. Schmidt et al., Prog. Photovolt: Res. Appl. 2008; 16:461-466 at 462. Instead, it is known to use aluminum oxide ($Al_2O_3$), which is known to normally have a high density of negative charge, as the passivation layer 170 for a P-type base 120. Id. Therefore, a different passivation layer other than silicon nitride is used for a p-type base 120. However, it can be more costly to maintain two different configurations of deposition equipment in order to apply two different passivation materials for the front and back surfaces of a solar cell. The present invention addresses these and other issues.

SUMMARY OF THE INVENTION

Systems and methods of the present invention can be used to charge the a charge-holding layer (such as a passivation layer and/or antireflective layer) of a solar cell with a positive or negative charge as desired. The charge-holding layer(s) of such a cell can include any suitable dielectric material capable of holding either a negative or a positive charge, and can be charged at any suitable point during manufacture of the cell, including during or after deposition of the charge-holding layer(s).

A method according to one aspect of the invention includes disposing a solar cell in electrical communication with an electrode inside a chamber. The solar cell includes an emitter, a base, a first passivation layer adjacent the emitter, and a second passivation layer adjacent the base. Gas is injected into the chamber and a plasma (emitting photons having an energy level of at least about 3.1 eV) is generated using the gas. One or more of the first passivation layer and the second passivation layer is charged to a predetermined polarity, wherein the charging includes applying a direct current voltage pulse to the electrode for a predetermined period of time.

A system according to another aspect of the invention a chamber includes a gas inlet configured to inject a gas into the chamber. The system further includes a plasma-generating electrode as well as a radio-frequency (RF) power supply electrically coupled to the plasma-generating electrode, the radio-frequency power supply configured to apply an alternating current to the plasma-generating electrode to generate a plasma by ionizing the gas, photons from the plasma having an energy level of at least about 3.1 eV. The system also includes a charging electrode configured to receive a provided solar cell such that the solar cell and charging electrode are in electrical communication. The solar cell includes an emitter, a base, a first passivation layer adjacent the emitter, and a second passivation layer adjacent the base. The system further includes a direct current power supply electrically coupled to the charging electrode, whereby when the direct current power supply applies a direct current pulse to the charging electrode for a predetermined period of time, one or more of the first passivation layer and the second passivation layer is charged to a predetermined polarity.

A method according to yet another aspect of the invention includes disposing a solar cell in electrical communication with an electrode inside a chamber, wherein the solar cell includes an emitter, a base, a first passivation layer adjacent the emitter, a first antireflective coating adjacent the first passivation layer, a back surface field (BSF) adjacent the base, and a second passivation layer adjacent the BSF. The method further includes injecting gas into the chamber and generating plasma using the gas, wherein photons from the plasma have an energy level of at least about 3.1 eV. One or more of the first antireflective coating and the second antireflective coating is charged to a predetermined polarity, wherein the charging includes applying a direct current voltage pulse to the electrode for a predetermined period of time.

A system according to yet another aspect of the invention comprises a chamber including a gas inlet configured to inject a gas into the chamber, a plasma-generating electrode, and a radio-frequency power supply electrically coupled to the plasma-generating electrode. The radio-frequency power supply is configured to apply an alternating current to the plasma-generating electrode to generate a plasma by ionizing the gas, photons from the plasma having an energy level of at least about 3.1 eV. The system further includes a charging electrode configured to receive a provided solar cell such that the solar cell and charging electrode are in electrical communication, wherein the solar cell includes an emitter, a base, a first passivation layer adjacent the emitter, a first antireflective coating adjacent the first passivation layer, a back surface field (BSF) adjacent the base, and a second passivation layer adjacent the BSF. The system also includes a direct current power supply electrically coupled to the charging electrode, whereby when the direct current power supply applies a direct current pulse to the charging electrode for a predetermined period of time, one or more of the first antireflective layer and the second antireflective layer is charged to a predetermined polarity.

DETAILED DESCRIPTION OF PREFERRED EMBODIMENTS

Figure 2:
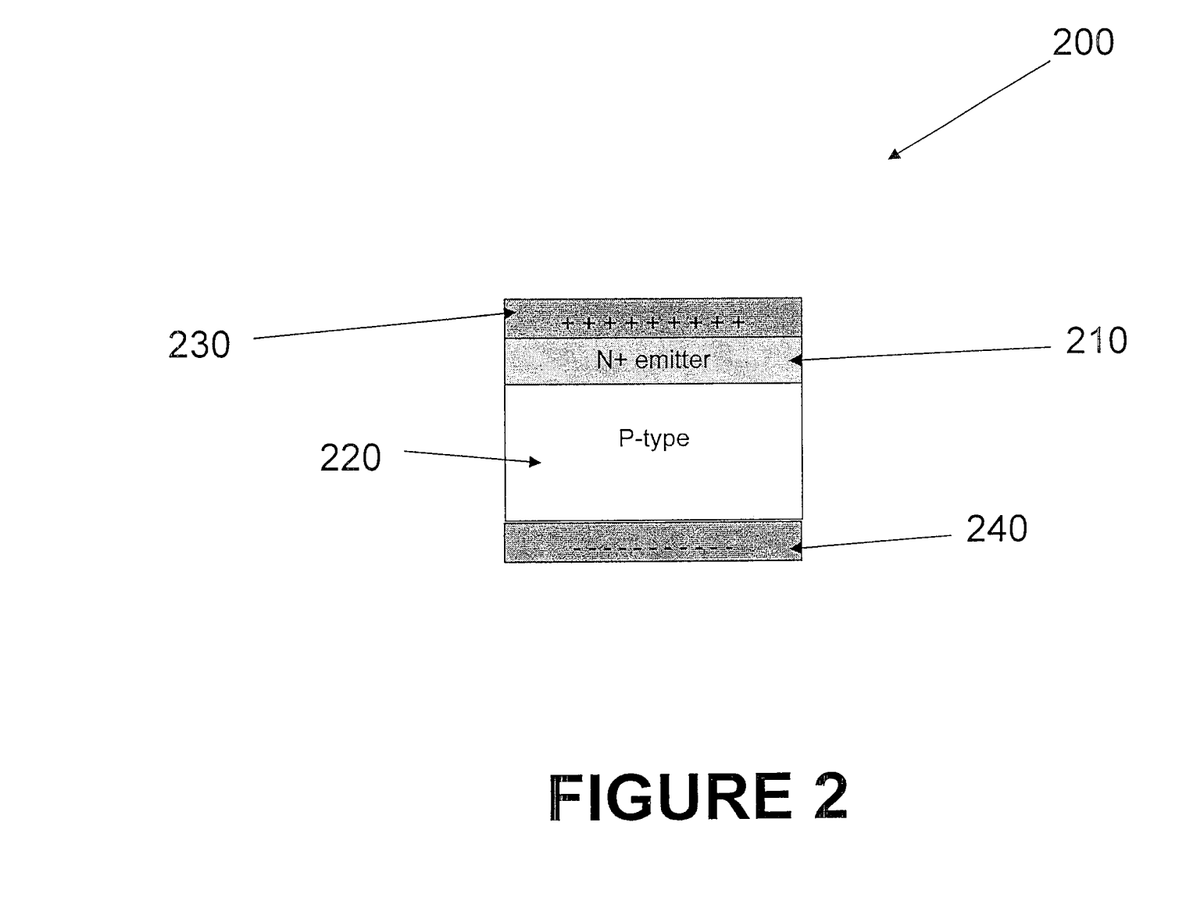
FIGS. 2, 3, 4A, 4B, and 4C illustrate exemplary embodiments of solar cells according to various aspects of the present invention.

Turning now to the figures, where the purpose is to describe preferred embodiments of the invention and not to limit same, a solar cell according to one embodiment of the present invention is depicted in FIG. 2. In this exemplary embodiment, solar cell 200 is a P-type cell which includes an emitter 210 comprising an N-type semiconductor layer (also known as an "N+ emitter") and a base 220 comprising a P-type semiconductor substrate. The cell 200 further includes a first passivation layer 230 adjacent to the emitter 210, and a second passivation layer 240 adjacent to the base 220. FIG. 2 also shows the desired charge types in the passivation layers (230, 240) for more effective surface passivation and thus higher cell efficiency, namely a positive charge in the front passivation layer 230 and a negative charge in the back passivation layer 240.

Figure 3:
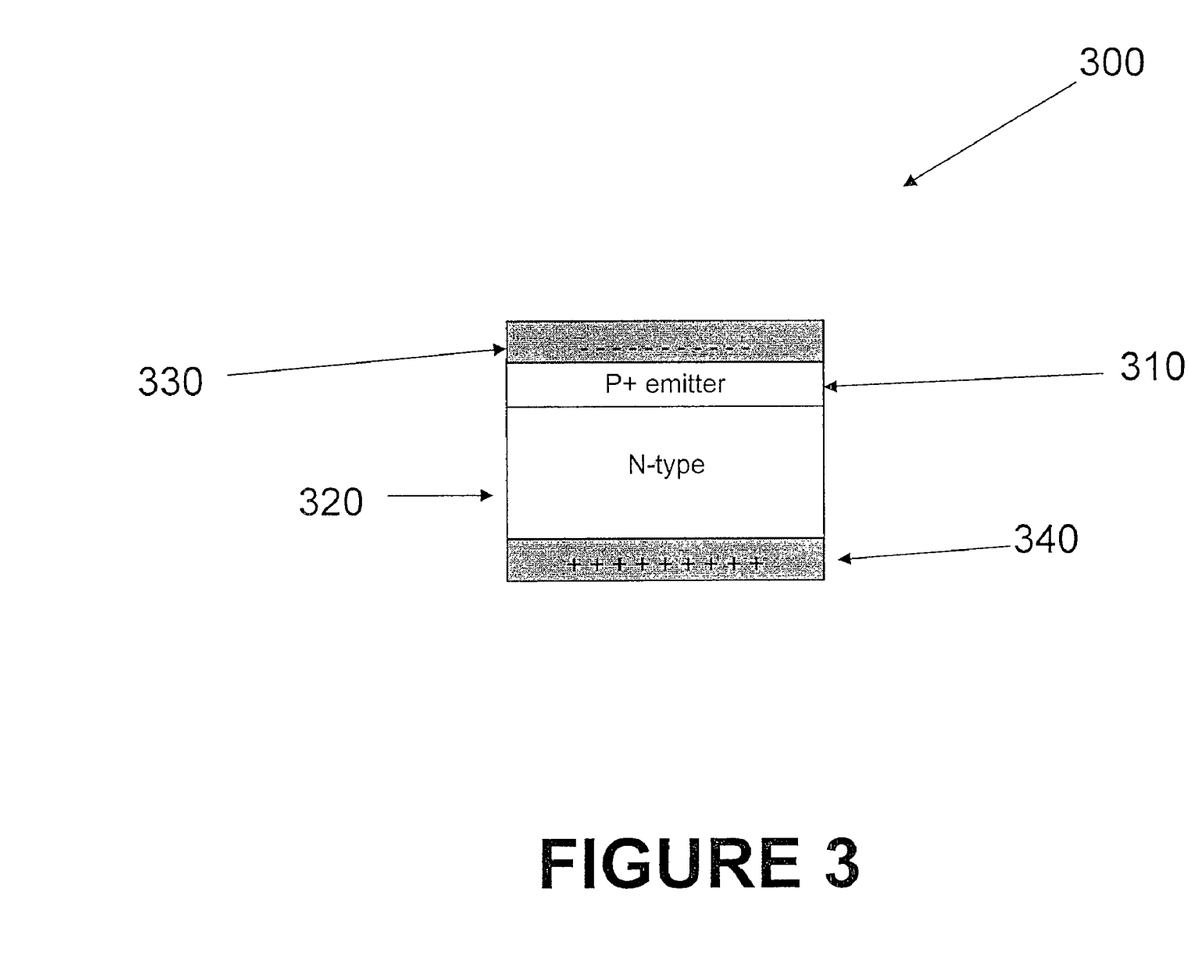

FIG. 3 depicts another exemplary embodiment of a solar cell according to aspects of the present invention. In this exemplary embodiment, solar cell 300 is an N-type cell and includes an emitter 310 comprising a P-type semiconductor layer (also known as an "P+ emitter") and a base 320 comprising an N-type semiconductor layer. Solar cell 300 may also be referred to as a "P-type cell." The cell 300 further includes a first passivation layer 330 adjacent to the emitter 310, and a second passivation layer 340 adjacent to the base 320. FIG. 3 also shows a negative charge in the front passivation layer 330 and positive charge in the back passivation layer 340.

In the exemplary solar cells 200 and 300, the N+ emitter 210 and N-type base 320 each include a semiconductor doped with an N-type dopant (such as phosphorous or arsenic for a silicon semiconductor material), while the P-type base 220 and P+ emitter 310 each include a semiconductor doped with a P-type dopant such as boron, gallium, and/or indium. In addition to silicon, emitters 210, 310 and bases 220, 320 may be formed from any suitable semiconductor material(s), such as germanium, gallium arsenide, and/or silicon carbide, as is known by those skilled in the art. In addition, in the exemplary solar cells 200 and 300, a thin silicon dioxide ($SiO_2$, also referred to as "oxide") interfacial layer can be added between the charged passivation layer and the semiconductor surface for further improvement of front and back surface passivation.

In FIGS. 2 and 3, emitters 210, 310 and bases 220, 320 are depicted as layers of uniform thickness, but emitters 210, 310 and bases 220, 320 may be any suitable, respective size, shape, or configuration, and need not be of uniform thickness.

Figure 4A:
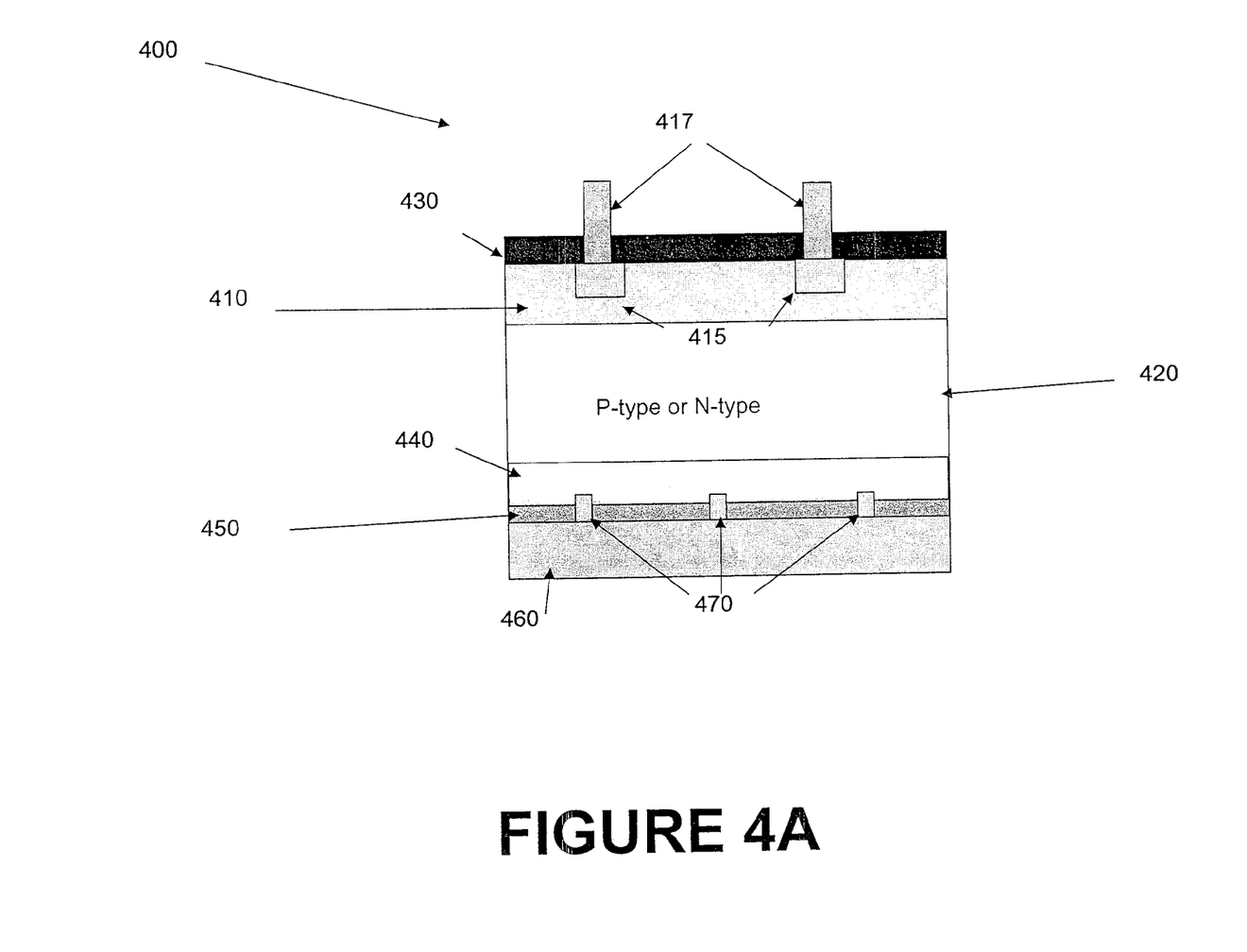

FIG. 4A depicts another exemplary solar cell configuration that may be used in conjunction with the present invention. In this embodiment, solar cell 400 includes a lightly-doped semiconductor region 410 formed on a semiconductor substrate 420. Selective emitters 415 are formed from heavily-doped semiconductor portions 415 (of the same type as the lightly-doped emitter) are formed in contact with metal (e.g., silver) grids 417. Substrate 420 is coupled to a back-surface field (BSF) region 440 of the same type as the base 420, which is formed by heavily doping the back surface of the wafer. Cell 400 further includes an anti-reflective coating and passivation layer 430 (such as silicon nitride) on its front surface, and a passivation layer 450 on its back surface. In this exemplary embodiment, passivation layer 450 may include silicon dioxide or silicon nitride. A metal layer 460 (formed from aluminum, for example) is coupled to the BSF layer 440 via contact holes 470.

Embodiments of the present invention may be utilized in conjunction with any other suitable solar cell configuration. For example, in some embodiments of the present invention, the back surface field layer 440 need not cover the entire back surface area of a wafer, which simplifies (and reduces the cost of) the manufacturing process by reducing or eliminating the high-doping process such as high-temperature diffusion or high-dose ion implantation required for formation of the back surface field layer. This is possible because an appropriately added charge to the back passivation layer (negative charge in the case of the P-type base) accumulates majority carriers (holes in this case), forming an effective back surface field layer without a heavy doping process.

Figure 4B:
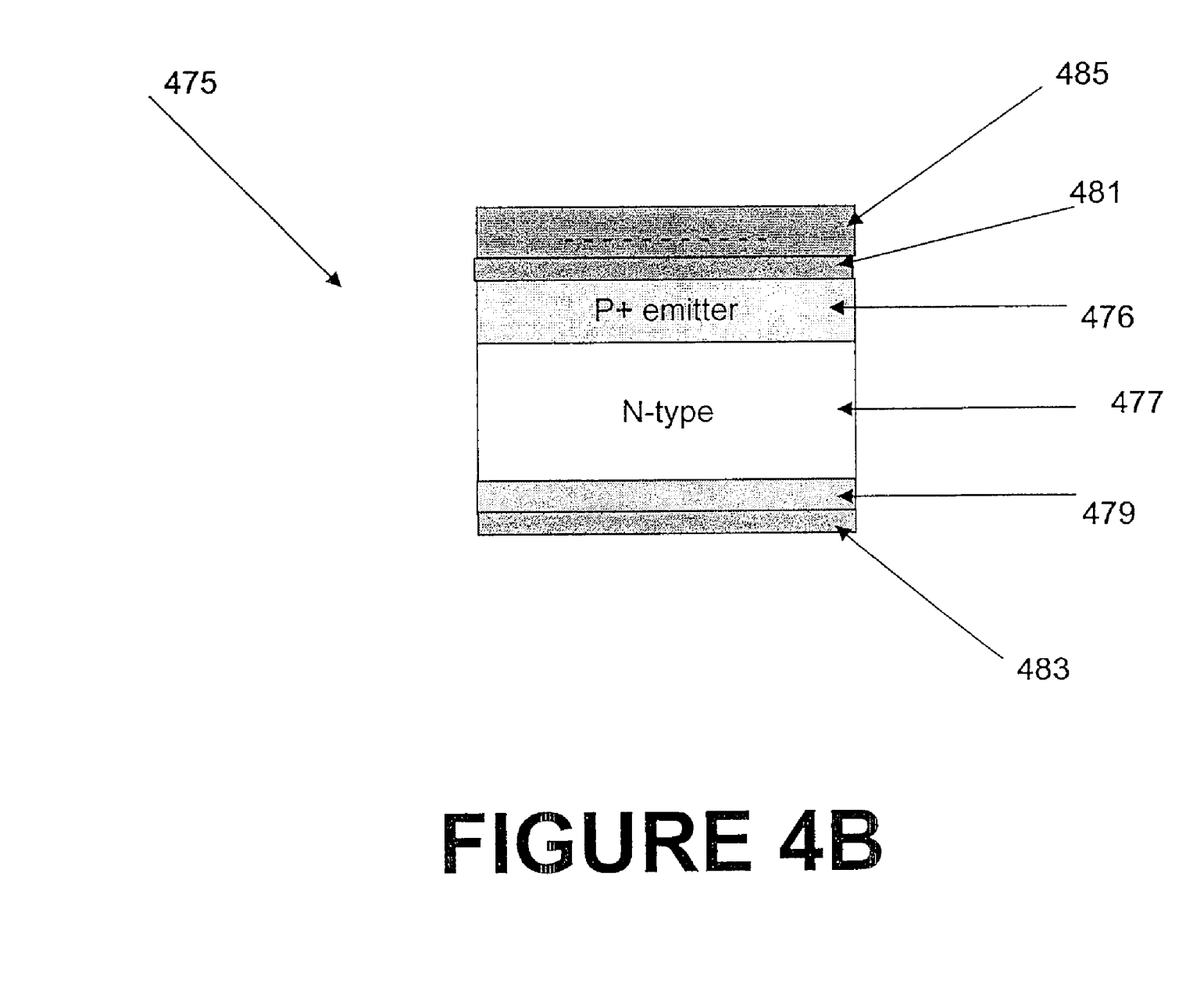

FIG. 4B depicts another exemplary solar cell configuration that may be used in conjunction with the present invention. In this embodiment, solar cell 475 is an N-type cell which includes a P+ emitter 476 and an N-type base 477. Cell 475 further includes a back surface field (BSF) 479 formed from an N-type semiconductor, a first passivation layer 481 adjacent to the emitter 476, and a second passivation layer 483 adjacent to the BSF 479. In this embodiment, the first (front) and second (back) passivation layers are preferably formed from silicon dioxide ($SiO_2$), though any other suitable material(s) may be used. Cell 475 includes an antireflective layer 485 adjacent the first passivation layer 481. The antireflective layer 485 is preferably negatively charged (as shown in FIG. 4B) for more effective surface passivation and higher cell efficiency. In one embodiment, the antireflective layer 485 is formed from silicon nitride ($Si_3N_4$) and may be negatively charged as described below. Among others, using silicon dioxide as the passivation material for the front (481) and back (483) passivation layers helps prevent charge loss in the antireflective layer 485 (e.g., formed from silicon nitride) and allows the cell 475 to be formed without the need for a silicon nitride layer on the back side of the wafer.

Figure 4C:
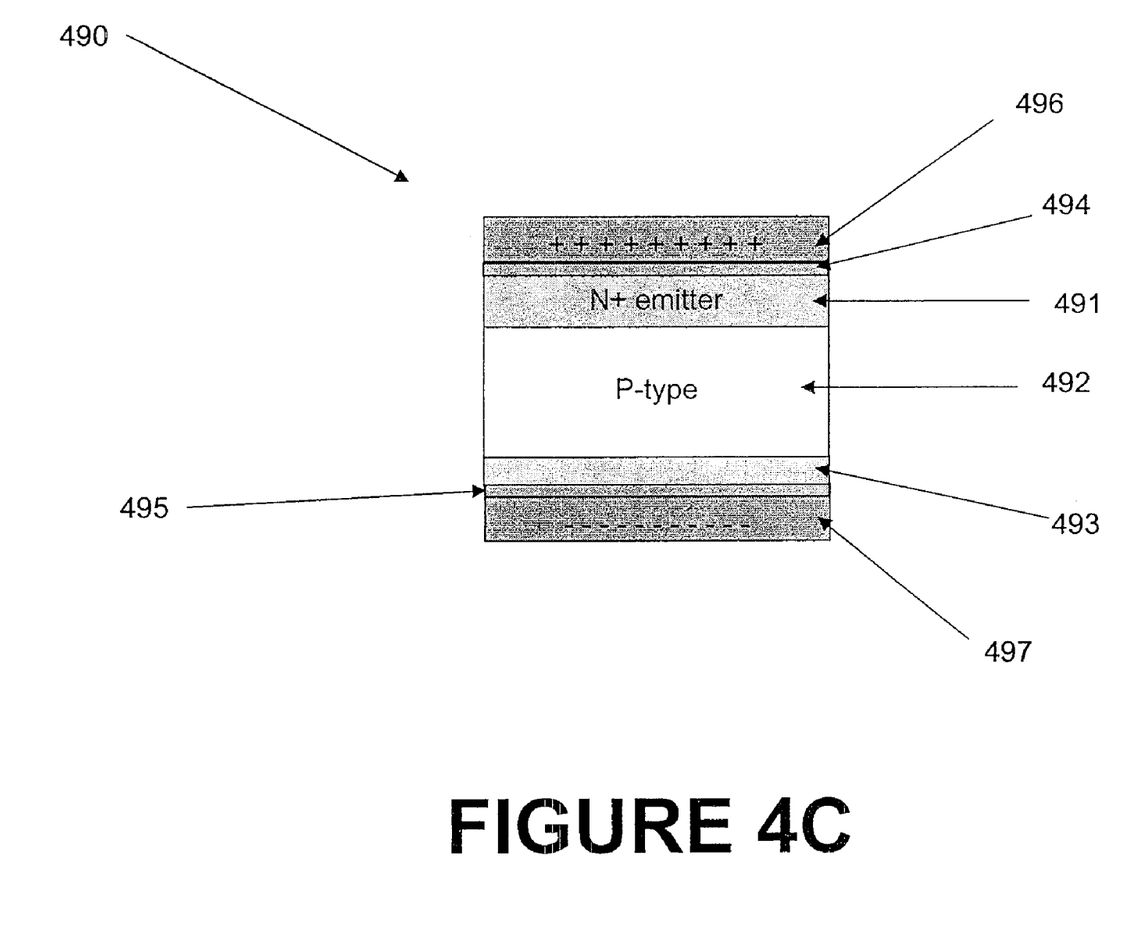

FIG. 4C depicts yet another exemplary solar cell configuration that may be used in conjunction with the present invention. In this embodiment, solar cell 490 is a P-type cell which includes an N+ emitter 491 and a P-type base 492. Cell 490 also includes a back surface field (BSF) 493 formed from a P-type semiconductor, a first passivation layer 494 adjacent to the emitter 491, and a second passivation layer 495 adjacent to the BSF 493. The first passivation layer 494 and second passivation layer 495 are preferably formed from silicon dioxide ($SiO_2$), though any other suitable material(s) may be used. Cell 490 further includes a first antireflective layer 496 adjacent the first passivation layer 494, and a second antireflective layer 497 adjacent the second passivation layer 495. As shown in FIG. 4C, the first antireflective layer 496 is preferably positively charged, while the second antireflective layer 497 is negatively charged for more effective surface passivation and higher cell efficiency. The first antireflective layer 496 and second antireflective layer 497 may be formed from the same or different material(s). In one embodiment, both layers 496 and 497 are formed from silicon nitride, and the second antireflective layer 497 can be negatively charged as described further below.

In exemplary embodiments of the present invention, the passivation layer adjacent to the emitter of a solar cell (e.g., passivation layers 230, 330, or 430) and the passivation layer adjacent the base (e.g., passivation layers 240, 340, or 450) each include a common material. Likewise, antireflective coatings 496 and 497 may include a common material. Among other things, this allows for solar cells to be manufactured in a more cost-effective manner than cells having different passivation and/or antireflective materials on their front and back surfaces. While the silicon nitride ($Si_3N_4$) is most preferred, any suitable charge-storing material may be used in conjunction with the present invention, including aluminum oxide ($Al_2O_3$), zirconium oxide ($ZrO_2$), and/or hafnium oxide ($HfO_2$). The front and back passivation and/or antireflective layers may be formed partially, or entirely, from a single material.

The front and back passivation and/or antireflective layers, as well as the BSF, may be any desired size, shape, configuration, or thickness. In one embodiment, a solar cell according to aspects of the present invention includes a front passivation layer and back passivation layer each having silicon nitride with a thickness of about 800 Å. In another exemplary embodiment, a solar cell includes front and back passivation layers formed from silicon dioxide with a thickness of about 10 nm. The front and back passivation layers need not be of the same size, shape, configuration, thickness, or include the same percentage of passivation material.

It is known to use silicon nitride as a material for storing a charge in the silicon nitride layer of Silicon-Oxide-Nitride-Oxide-Silicon (SONOS) non-volatile memories. In SONOS non-volatile operation, a positive biasing to a control gate with respect to silicon substrate causes the $Si_3N_4$ layer to store a negative charge. Conversely, a negative biasing to the control gate causes the $Si_3N_4$ layer to store a positive charge.

In solar cells, however, since there is no gate electrode to which an external bias can be applied in order to charge a silicon nitride passivation layer, a different charging method has to be used. In one embodiment of the present invention, passivation layers of a charge-storing material that can store either a positive or negative charge (such as $Si_3N_4$) can be applied to both the front and back (e.g., layers 230 and 240, respectively) of a solar cell, and either passivation layer positively or negatively charged, as desired. Either the front or back passivation layer of a solar cell can be charged, either positively or negatively, at any suitable point during the manufacture of the solar cell. For example, a charging apparatus may be added to a PECVD deposition tool to deposit and charge the passivation and/or antireflective material (e.g., $Si_3N_4$) in situ. Alternatively, the passivation layers of a solar cell may be charged by a stand-alone tool during processing of the solar cell. The passivation layers may also be charged separately or simultaneously. The passivation layers of a solar cell may be charged in any other suitable manner.

Figure 5:
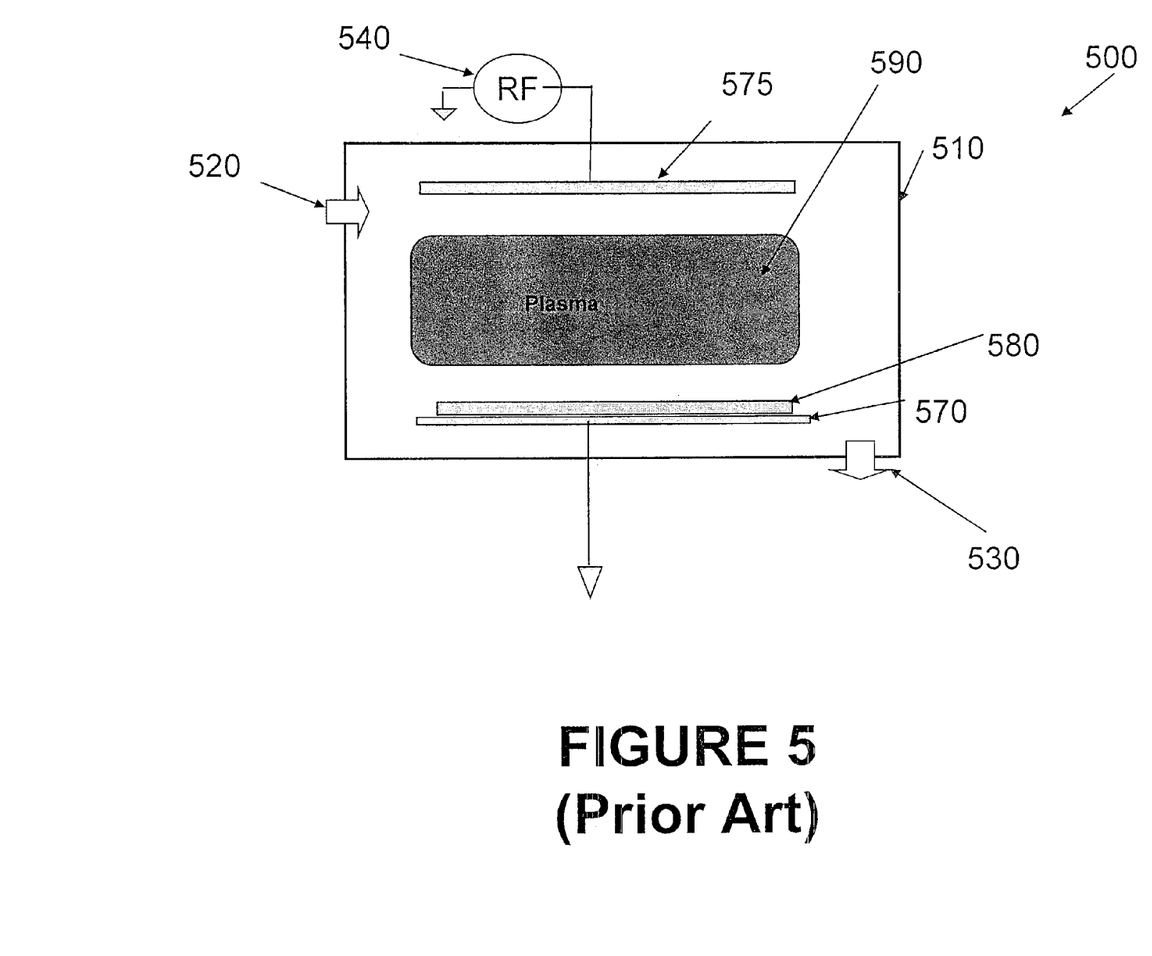
FIG. 5 illustrates the configuration of a conventional PECVD SiN deposition system.

FIG. 5 illustrates an example of a conventional system for PECVD. System 500 includes a chamber 510, gas inlet 520, and gas outlet 530. A radio-frequency power supply 540 is in electrical communication with one or more plasma-generating electrodes 575. Electrode 570 supports, and is in electrical communication with, solar cell wafer 580.

The system 500 may be used to, among other things, deposit passivation and/or antireflective layers onto the solar cell 580. In such a case, the chamber 510 is evacuated using the gas outlet 530 and a gas comprising silane ($SiH_4$) and ammonia ($NH_3$) is injected into the chamber using the gas inlet 520. Power from the RF power supply 540 is applied to the plasma-generating electrode 575, which generates plasma 590 by ionizing the silane/ammonia gas. An electric field is also created between the bottom electrode 570 (which is coupled to electrical ground) and top electrode 575, causing ions to stream from the plasma 590 to the surface of solar cell 580, depositing a silicon nitride layer on the solar cell 580. The silicon nitride layer can be used as a passivation and/or antireflective coating on the solar cell 580 as described above.

The silicon nitride layer is positively-charged as deposited during PECVD, which is suitable where the silicon nitride layer is a passivation/antireflective layer adjacent an N-type semiconductor material, but is not normally suitable where the silicon nitride layer is adjacent a P-type material (in which case the passivation/antireflective layer should be negatively-charged). In one exemplary embodiment of the present invention, referring now to FIG. 6, system 600 includes a DC power supply 610 and switch 620 to provide for in-situ charging of the passivation layers of a solar cell 580. In this embodiment the DC power supply 610 is coupled to the electrode 570 via the switch 620. The switch 620 can be toggled to connect the electrode 570 either to electrical ground (to allow a passivation layer to be deposited on the solar cell 580 using PECVD) or to the DC power supply 610 (to allow in-situ charging of the deposited passivation layer).

Figure 6:
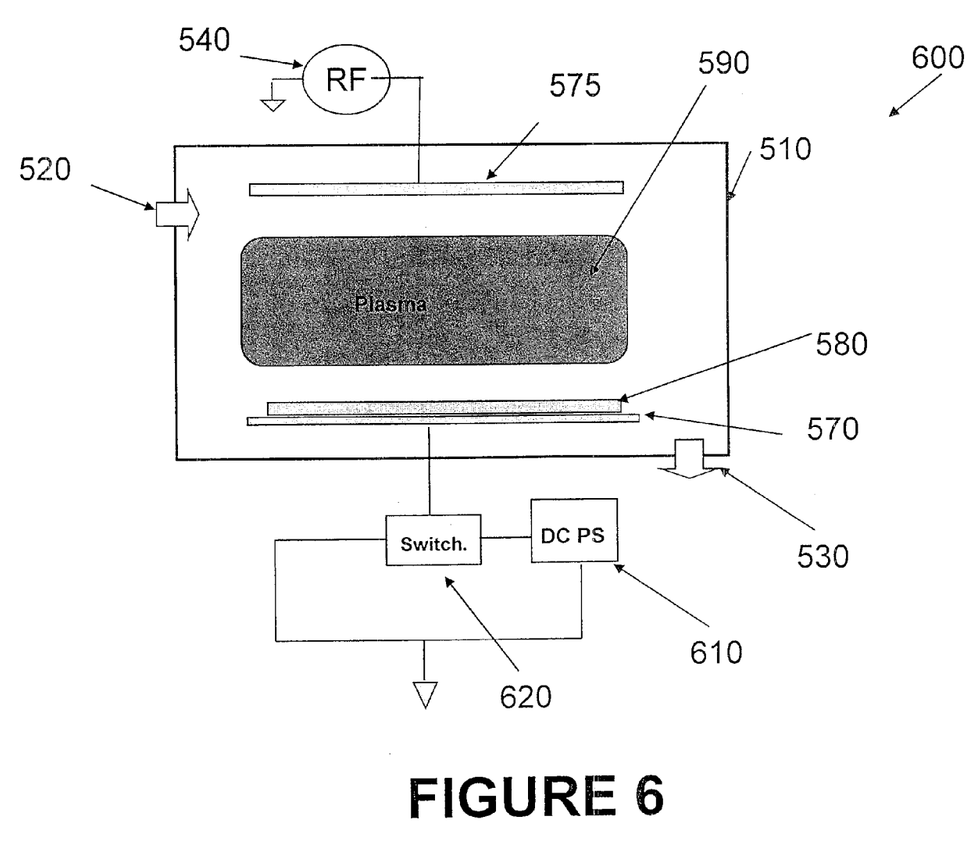
FIGS. 6 and 7 illustrate exemplary systems for charging the passivation layer(s) of a solar cell according to various aspects of the present invention.

To negatively-charge the top passivation and/or antireflective layer (i.e., the layer on the surface of the solar cell 580 distal to electrode 570) deposited on the solar cell 580 using PECVD in chamber 510, the silane and ammonia gas from the PECVD process in chamber 510 is evacuated using gas outlet 530, and a gas (preferably an inert gas or gasses, such as nitrogen, argon, and/or helium) injected into the chamber 510 for generation of a plasma that emits ultraviolet light (i.e., the energy level of photons from the plasma are at least about 3.1 eV).

Although embodiments of the present invention are not restricted to using nitrogen, argon, and/or helium, these inert gases are better able to produce high-energy photons (compared to silane and ammonia, which produce relatively low-energy photons) which in turn generate electron-hole pairs at the surface of the silicon (e.g., emitter or base) and passivation/antireflective layer of the solar cell 580. These electron-hole pairs can be used to charge the antireflective and/or passivation layer(s) of the cell 580 as described below. While embodiments of the present invention are not restricted to using plasma that generates plasma light with any particular energy level or wavelength, the plasma light generated in one embodiment of the invention is preferably at least about 3.1 eV.

Once the plasma 630 is generated, high-energy photons from the light of the plasma 630 generate electron-hole pairs at the surface of the silicon in the solar cell 580 and in the silicon nitride layer if the photon energy is greater than the silicon nitride band gap (i.e., greater than about 5.1 eV). Switch 620 disables the electrical connection between ground and the electrode 570, while enabling the electrical connection between the direct current power supply 610 and electrode 570. The direct current power supply 610 applies a DC voltage pulse to the electrode 570 (also referred to herein as the "charging electrode" 570) for a predetermined period of time, which generates an electric field between the charging electrode 570 and electrode 575, resulting in the top charge-holding layer of the solar cell (i.e., the passivation and/or antireflective layer on the surface of the solar cell 580 that is distal to the charging electrode 570) being positively or negatively charged, depending on the polarity of the DC pulse.

The pulse may be positively or negatively biased to negatively charge the top silicon nitride layer. If the pulse is positively biased, it is believed that electrons are pushed from the plasma and injected into the silicon nitride layer on the top surface of the solar cell 580. If the pulse is negatively biased, it is believed that photo-generated electrons at the surface of the solar cell are pushed into the top silicon nitride layer. Alternatively, a negative DC pulse, in conjunction with a photon energy level greater than the silicon nitride band gap (i.e., greater than about 5 eV) pushes photo-generated holes in the silicon nitride passivation layer out of the top silicon nitride passivation layer. Accordingly, though embodiments of the invention are not restricted to any particular theory of operation, a positive or negative pulse can negatively charge the top silicon nitride layer, depending on the photon energy level and the polarity and duration of the DC pulse.

System 600 may also be used to positively charge a passivation layer. As described previously, some passivation materials (such as aluminum oxide) are negatively charged when deposited on a solar cell. In such cases, the DC voltage pulse applied to the electrode 570 is preferably positively biased. It is believed the positively-biased pulse pushes holes (from the electron-hole pairs generated at the surface of the solar cell 580 by the plasma light) into the passivation material, and/or pushes electrons (from the electron-hole pairs generated in the passivation layer by the plasma light) out from the passivation layer, resulting in the passivation material being positively charged. This method can also be used, for example, to add more positive charge to silicon nitride than its as-deposited positive charge.

Figure 7:
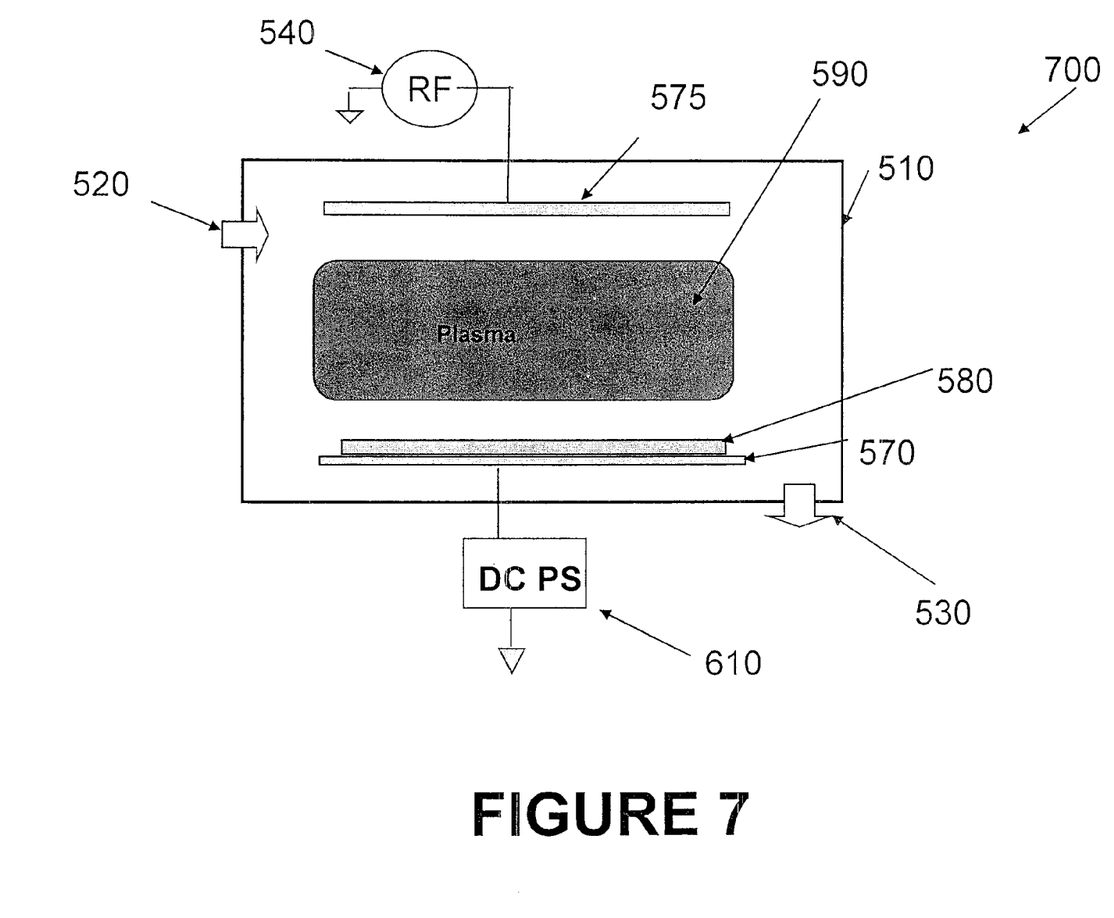

In another exemplary embodiment, referring now to FIG. 7, system 700 illustrates a stand-alone system for charging the passivation layer(s) of a solar cell. In this embodiment, the charging electrode 570 is electrically coupled to a direct current power supply 610. System 700 is not configured to perform the silicon nitride PECVD deposition, but instead only uses nitrogen or argon gas to generate a plasma and charges the passivation and/or antireflective layer(s) (already deposited by a PECVD system) of solar cell 580. Otherwise, system 700 functions as described above for systems 500 and 600. The system 700 may be used to supply a separate charging chamber, in addition to a PECVD chamber for depositing the passivation layer, for manufacturing a solar cell. Among other things, this may help increase the overall throughput of solar cells manufactured since a PECVD chamber can be depositing passivation layers on a first solar cell while system 700 is used to charge the passivation layer(s) of a second solar cell.

Any suitable direct current power supply may be used in conjunction with embodiments of the present invention. The direct current power supply may be configured to generate a pulse of any desired voltage, and can be applied for any desired amount of time. For example, the voltage of the direct current pulse may be between about 10 volts and about 5,000 volts, and may be applied for between about 1 microsecond and about 10 seconds. The solar cell 580 may be of any desired configuration, such as that of solar cells 200, 300, 400, 475, or 490 described above. Systems and methods of the present invention may be used to charge passivation layers formed from any suitable material, including those described previously.

Figure 8:
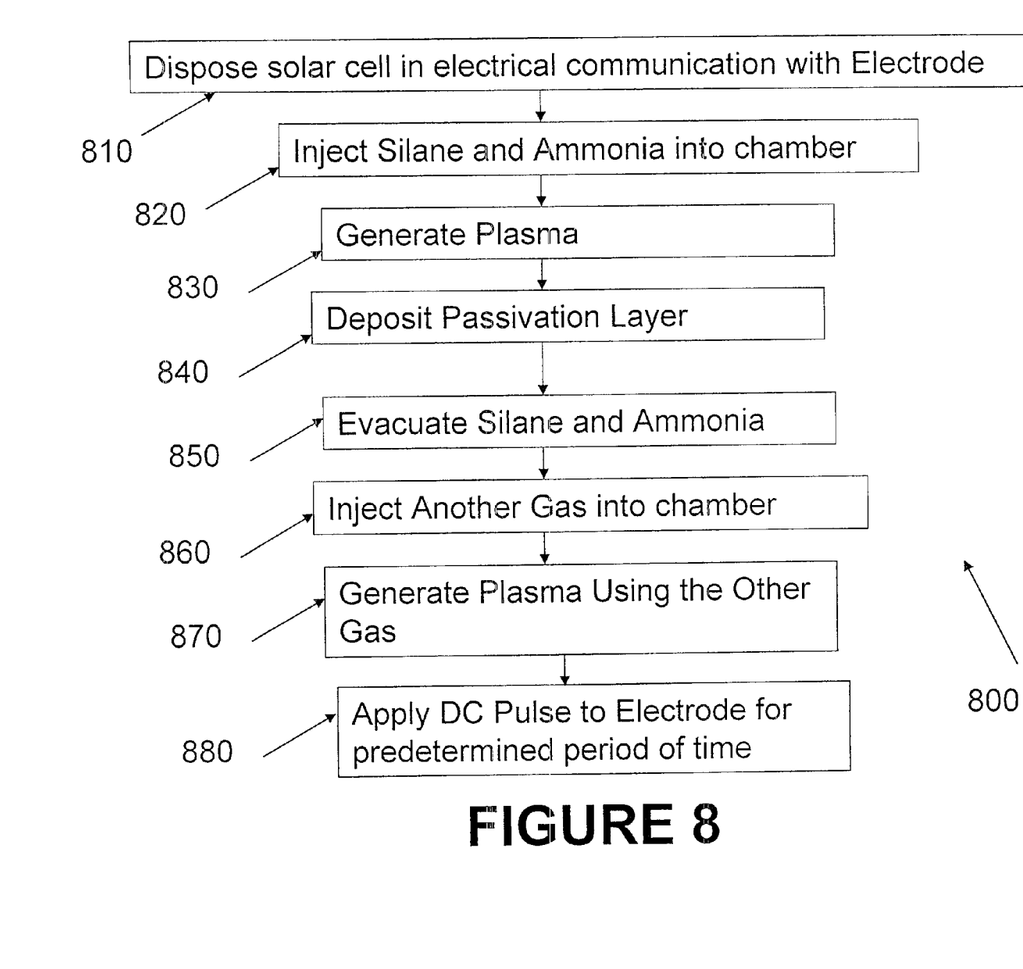
FIG. 8 illustrates an exemplary method for charging the passivation layer(s) of a solar cell according to various aspects of the present invention.

An exemplary method for charging the passivation layer(s) of a solar cell is depicted in FIG. 8. This method may be performed (in whole or in part) using any suitable system, including systems 600 and 700 depicted in FIGS. 6 and 7, respectively. In this method, a solar cell is disposed within a chamber and in electrical communication with an electrode (810), such as charging electrode 570. Silane and ammonia gas is injected into the chamber (820), a plasma is generated using the silane and ammonia gas (830), and a passivation and/or antireflective layer(s) is deposited on the solar cell (840).

If the antireflective/passivation layer(s) of the solar cell are to be charged in situ (e.g., using system 600 in FIG. 6), the Silane and ammonia is evacuated from the chamber (850), and another gas (e.g., an inert gas or gasses such as argon, nitrogen, and/or helium) injected into the chamber (860). A plasma is generated from the other gas (870), and a direct current pulse is applied to the charging electrode for a predetermined period of time (880).

The particular implementations shown and described above are illustrative of the invention and its best mode and are not intended to otherwise limit the scope of the present invention in any way. Indeed, for the sake of brevity, conventional data storage, data transmission, and other functional aspects of the systems may not be described in detail. Methods illustrated in the various figures may include more, fewer, or other steps. Additionally, steps may be performed in any suitable order without departing from the scope of the invention. Furthermore, the connecting lines shown in the various figures are intended to represent exemplary functional relationships and/or physical couplings between the various elements. Many alternative or additional functional relationships or physical connections may be present in a practical system.

Changes and modifications may be made to the disclosed embodiments without departing from the scope of the present invention. These and other changes or modifications are intended to be included within the scope of the present invention, as expressed in the following claims.

What is claimed is:

1. A method comprising:
   (a) disposing a solar cell in electrical communication with an electrode inside a chamber,
   wherein the solar cell includes:
      an emitter;
      a base;
      a first passivation layer adjacent the emitter; and
      a second passivation layer adjacent the base;
   (b) injecting gas into the chamber;
   (c) generating plasma using the gas, wherein photons from the plasma have an energy level of at least about 3.1 eV; and
   (d) charging one or more of the first passivation layer and the second passivation layer to a predetermined polarity, wherein the charging includes applying a direct current voltage pulse to the electrode for a predetermined period of time.

2. The method of claim 1, wherein the emitter is an N-type emitter, and the base is a P-type base.

3. The method of claim 2, wherein the emitter comprises an N+emitter.

4. The method of claim 3, wherein the second passivation layer is distal to the electrode and the first passivation layer is proximate to the electrode 5. The method of claim 4, wherein after the direct current pulse is applied to the electrode, the first passivation layer is positively charged, and the second passivation layer is negatively charged.

6. The method of claim 1, wherein the emitter is a P-type emitter, and the base is an N-type base.

7. The method of claim 6, wherein the emitter comprises a P+emitter.

8. The method of claim 7, wherein the first passivation layer is distal to the electrode and the second passivation layer is proximate to the electrode.

9. The method of claim 8, wherein after the direct current pulse is applied to the electrode, the first passivation layer is negatively charged, and the second passivation layer is positively charged.

10. The method of claim 1, wherein the first passivation layer is in direct contact with the emitter.

11. The method of claim 1, wherein the second passivation layer is in direct contact with the base.

12. The method of claim 1, wherein the first passivation layer and the second passivation layer include a common passivation material.

13. The method of claim 1, wherein the gas includes an inert gas.

14. The method of claim 13, wherein the inert gas includes one or more of argon, nitrogen, and helium.

15. The method of claim 1, wherein the first passivation layer and the second passivation layer each consist essentially of silicon nitride ($Si_3N_4$).

16. The method of claim 1, wherein the first passivation layer and the second passivation layer are each deposited using plasma enhanced chemical vapor deposition (PECVD).

17. The method of claim 16, wherein the PECVD includes:
   injecting silane ($SiH_4$) and ammonia ($NH_3$) into the chamber; and
   generating another plasma using the $SiH_4$ and $NH_3$.

18. The method of claim 1, wherein the predetermined period of time is between about 1 microsecond and 10 seconds.

19. The method of claim 1, wherein the direct current pulse has a voltage of between about 10 volts and about 5,000 volts.

20. The method of claim 1, wherein the direct current pulse is positively biased.

21. The method of claim 1, wherein the direct current pulse is negatively biased.

* * * * *